(12) United States Patent
Iijima

(10) Patent No.: US 8,028,972 B2
(45) Date of Patent: Oct. 4, 2011

(54) GATE VALVE FOR VACUUM APPARATUS

(75) Inventor: Eiichi Iijima, Chigasaki (JP)

(73) Assignee: Ulvac, Inc, Kanagawa (JP)

( * ) Notice: Subject to any disclaimer, the term of this patent is extended or adjusted under 35 U.S.C. 154(b) by 424 days.

(21) Appl. No.: 12/084,714

(22) PCT Filed: Nov. 28, 2006

(86) PCT No.: PCT/JP2006/323682
§ 371 (c)(1),
(2), (4) Date: May 8, 2008

(87) PCT Pub. No.: WO2007/066537
PCT Pub. Date: Jun. 14, 2007

(65) Prior Publication Data
US 2009/0250648 A1    Oct. 8, 2009

(30) Foreign Application Priority Data
Dec. 5, 2005    (JP) .................................. 2005-351071

(51) Int. Cl.
*F16K 1/16*    (2006.01)
(52) U.S. Cl. ........................................ 251/302; 251/327
(58) Field of Classification Search ................. 251/301, 251/302, 326, 327; 137/340, 338
See application file for complete search history.

(56) References Cited

U.S. PATENT DOCUMENTS

| | | | | |
|---|---|---|---|---|
| 2,109,042 A | * | 2/1938 | Bennett et al. ................. | 251/142 |
| 2,134,324 A | * | 10/1938 | Brackett ............................. | 87/1 |
| 3,557,822 A | * | 1/1971 | Chronister ............... | 137/315.32 |
| 3,665,953 A | * | 5/1972 | Chronister ............... | 137/246.22 |
| 3,799,188 A | * | 3/1974 | Chronister ..................... | 137/271 |
| 5,062,445 A | * | 11/1991 | Junier ........................... | 137/340 |
| 6,448,567 B1 | * | 9/2002 | Botelho et al. ........... | 250/492.21 |
| 2004/0104682 A1 | * | 6/2004 | Horsky et al. ............ | 315/111.81 |

FOREIGN PATENT DOCUMENTS

| | | | |
|---|---|---|---|
| JP | 48-063832 | * | 8/1973 |
| JP | 55-109169 | * | 7/1980 |
| JP | 62-093467 | * | 6/1987 |
| JP | 2-074671 | * | 6/1990 |
| JP | 4-106583 | * | 9/1992 |

* cited by examiner

*Primary Examiner* — John Fristoe, Jr.
*Assistant Examiner* — Marina Tietjen
(74) *Attorney, Agent, or Firm* — Carothers & Carothers

(57) ABSTRACT

Even when a gate valve for a vacuum apparatus used in a vapor deposition apparatus is in an open position, reliability of keeping a vapor deposition chamber vacuum can be improved by protecting an inner wall surface of a valve casing and a sealing member of a valve body against a vapor of a vapor deposition material. A gate valve (1) for a vacuum apparatus (50) is used as a gate valve for an electron gun (52). When the valve is in a closed position, as with the related art technique, a valve body (3) detaches an electron gun (52) part from a vapor deposition chamber (51). On the other hand, when the valve is in an open position, a valve chamber (15) is separated from the vapor deposition chamber (51) by inserting a cylindrical movable shield (22) into the valve chamber (15) to prevent the inner wall surface of a valve casing (2) and a sealing member (5,6,7) of the valve body (3) from being exposed to vapor in the vapor deposition chamber (51), with the result that they are protected against the deposition of a deposition material (MgO) (81).

1 Claim, 7 Drawing Sheets ered as an example of the above-mentioned vacuum apparatus, a continuous operation is performed for two weeks or more. Further, in an apparatus equipped with an automatic MgO supply mechanism, a continuous operation can be performed for a month. However, consumable parts of an electron gun, such as a filament or a cathode, need to be exchanged every two or three weeks. In another case, when an accident occurs, only an electron gun part is sometimes put under an atmospheric pressure to carry out maintenance. In this case, when a gate valve is provided between the electron gun part and the vapor deposition chamber and only the electron gun part is put under the atmospheric pressure by closing the gate valve at the time of exchange so that the maintenance can be performed, the vapor deposition chamber can be kept in a vacuum. As a result, it can be expected to significantly reduce the start-up time for resumption of the operation.

GATE VALVE FOR VACUUM APPARATUS

TECHNICAL FIELD

The present invention relates to a gate valve used for a vacuum apparatus, and specifically, to a gate valve for an electron gun of a vapor deposition apparatus.

BACKGROUND ART

In a vacuum apparatus used in manufacturing a semiconductor, a thin film, a liquid crystal, or the like, a gate valve for opening/closing each vacuum chamber is employed.

In related art, various kinds of gate valves for vacuum apparatuses are known. For example, an inflation-sealing member is used when closing a valve, so that a sealing performance is enhanced (see, for example, Patent Documents 1 and 2). In addition, a pendulum gate valve or the like is also known.

FIGS. 5 and 6 show an example of a pendulum gate valve. In a pendulum gate valve 200 in related art, an opening 204b is formed on a sidewall 202b of a valve casing 202, as viewed from a front thereof (FIG. 6). The valve 200 further includes a valve chamber 215 formed between a sidewall 202a and the sidewall 202b facing each other, a pendulum valve body 203 provided in the valve chamber 215, and a sealing ring 205, as viewed inside the valve casing 202 from a side thereof. On the sidewalls 202a and 202b facing each other, an opening 204a and the opening 204b are formed. To the sealing ring 205, ring-shaped sealing members 206 and 207 are attached (FIG. 5).

When closing the valve 200 in an open state, an air actuator 209 provided on a side of the valve casing 202 is driven by using an air pressure, and an actuator shaft 208 is rotated to move the pendulum valve body 203 up to in front of the opening 204a, i.e., a valve closing, position. Then, an air cylinder 211 is driven by using the air pressure to move a shaft 210, and the sealing ring 205 is pressed against the valve body 203. Thus, in the valve casing 202, the sealing member 207 seals a gap between an inner wall surface around the opening 204b and the sealing ring 205, and the sealing member 206 seals a gap between a surface of the valve body 203 and the sealing ring 205. As a result, a gap between the opening 204a and the opening 205b is blocked.

In a vacuum chamber of a vacuum vapor deposition apparatus, a vapor deposition material such as a metal, a metal oxide, or a metal compound is evaporated by heating (see FIG. 7). In this case, a vapor of the vapor deposition material generated from a vaporization source gets into an electron gun 252, which causes a problem in that it is difficult to continuously and stably generate a beam for a long time period. To solve this problem, various measures have been tried but failed.

For example, exhaust means for exhausting a gas in the vicinity of an exit hole of an electron beam has been provided like the vacuum vapor deposition apparatus shown in FIG. 7. Alternatively, a trap (not shown) for trapping the vapor of the vapor deposition material has been provided in front of the exit hole of the electron beam (see, Patent Document 3).

However, in the case of MgO, MgO gets into the electron gun in a significant amount, so that a sufficient effect cannot be obtained. Even if the vapor of the vapor deposition material can be prevented from getting into the electron gun, periodical maintenance such as an exchange of a filament is required.

Patent Document 1: Japanese Patent Application Laid-Open No. 2000-145980 (page 3, FIG. 1)
Patent Document 2: Japanese Patent Application Laid-Open No. 2004-360754 (page 4, FIG. 1)
Patent Document 3: Japanese Patent Application Laid-Open No. Hei 7-58832 (page 4, FIG. 1)

DISCLOSURE OF THE INVENTION

Problem to be Solved by the Invention

In an in-line MgO vapor deposition apparatus as an example of the above-mentioned vacuum apparatus, a continuous operation is performed for two weeks or more. Further, in an apparatus equipped with an automatic MgO supply mechanism, a continuous operation can be performed for a month. However, consumable parts of an electron gun, such as a filament or a cathode, need to be exchanged every two or three weeks. In another case, when an accident occurs, only an electron gun part is sometimes put under an atmospheric pressure to carry out maintenance. In this case, when a gate valve is provided between the electron gun part and the vapor deposition chamber and only the electron gun part is put under the atmospheric pressure by closing the gate valve at the time of exchange so that the maintenance can be performed, the vapor deposition chamber can be kept in a vacuum. As a result, it can be expected to significantly reduce the start-up time for resumption of the operation.

Accordingly, in the example of the in-line MgO vapor deposition apparatus 250 shown in FIG. 7, the gate valve for a vacuum apparatus 200 in related art is used.

In FIG. 7, an inside of a vapor deposition chamber 251 of the in-line MgO vapor deposition apparatus 250 is kept in a vacuum by an exhaust device (vacuum pump) (not shown) connected to an exhaust port 253.

To perform the vapor deposition process on a vapor deposition target 280 in the figure, a vaporization source 254 containing a vapor deposition material (MgO) 281 is disposed at a position opposed to the vapor deposition target 280 in a lower part of the apparatus.

Further, the electron gun 252 serving as a heat source for irradiating the vapor deposition material 281 with an electron beam is lateral to the vaporization source 254.

Herein, in front of the electron gun 252, a gate valve for a vacuum apparatus 200 is disposed as a valve for separating the electron gun part and the vapor deposition chamber 251. When the gate valve 200 is closed, the electron gun 252 can be maintained while keeping the vapor deposition chamber 251 in a vacuum.

Further, to enable the continuous operation, the vapor deposition apparatus 250 includes an automatic supply mechanism 260 for automatically supplying the vapor deposition material. The automatic supply mechanism 260 is constituted of an MgO supply chamber (for storing MgO in a vacuum) 261, an MgO feeder (for quantitatively and continuously supplying MgO to the vaporization source) 263, and an MgO shooter 264.

MgO 282 of about 5 to 200 kg or more is stored in the MgO supply chamber 261, and a required amount of MgO of about 1 to 1.5 kg is intermittently supplied to the MgO feeder 263. To perform the intermittent operation, an MgO supply valve 267 is moved by using an air cylinder 266. MgO is fed into the vaporization source 254 by the feeder 263 while sliding on the MgO shooter 264.

However, in the gate valve for a vacuum apparatus 200 in related art, the valve chamber 215 in the valve casing 202 remains in communication with the vapor deposition chamber 251 when the valve is in an open position. In this case, the inner wall surface of the valve casing 202 and the valve body 203 are exposed to the vapor of the vapor deposition material (MgO) 281. Therefore, the vapor deposition material (MgO) is adhered to surroundings of the sealing members 206 and 207 between the inner wall surface of the valve casing 202 and the sealing ring 205 and between the valve body 203 and the sealing ring 205, respectively, so that reliability for keeping a vacuum is extremely low. Accordingly, the vapor deposition chamber 251 needs to be maintained under the atmospheric pressure.

Means for Solving the Problem

When the valve is closed, the valve body separates the electron gun part from the vapor deposition chamber, as in related art. When the valve is opened, the cylindrical movable shield is inserted into the valve casing from the opening on the vapor deposition chamber side so that the valve casing is separated from the vapor deposition chamber and the inner wall surface of the valve casing and the valve body are protected against adhesion of the vapor deposition material (MgO). The above-mentioned measures can prevent adhesion of the vapor deposition material (MgO) to a valve seat surface and solve the problem in that the vacuum state cannot be maintained. In addition, the inner wall surface of the valve casing and the valve body each include sealing members such as a sticker and an O-ring. The movable shield also prevents adhesion of the vapor deposition material (MgO) to the members.

EFFECT OF THE INVENTION

It is possible to reduce downtime in the continuous operation of the in-line MgO vapor deposition apparatus. Further, the vapor deposition chamber can be less frequently released to the atmospheric pressure.

BRIEF DESCRIPTION OF THE DRAWINGS

FIGS. 2A and 2B are explanatory diagrams showing an operation of the gate valve for an electron gun according to the present invention (an explanatory diagram showing the inside of the valve casing as viewed from the side of the main body thereof), in which FIG. 2A shows a state where the valve is opened and FIG. 2B shows a state where the valve is closed.

Figure 1:
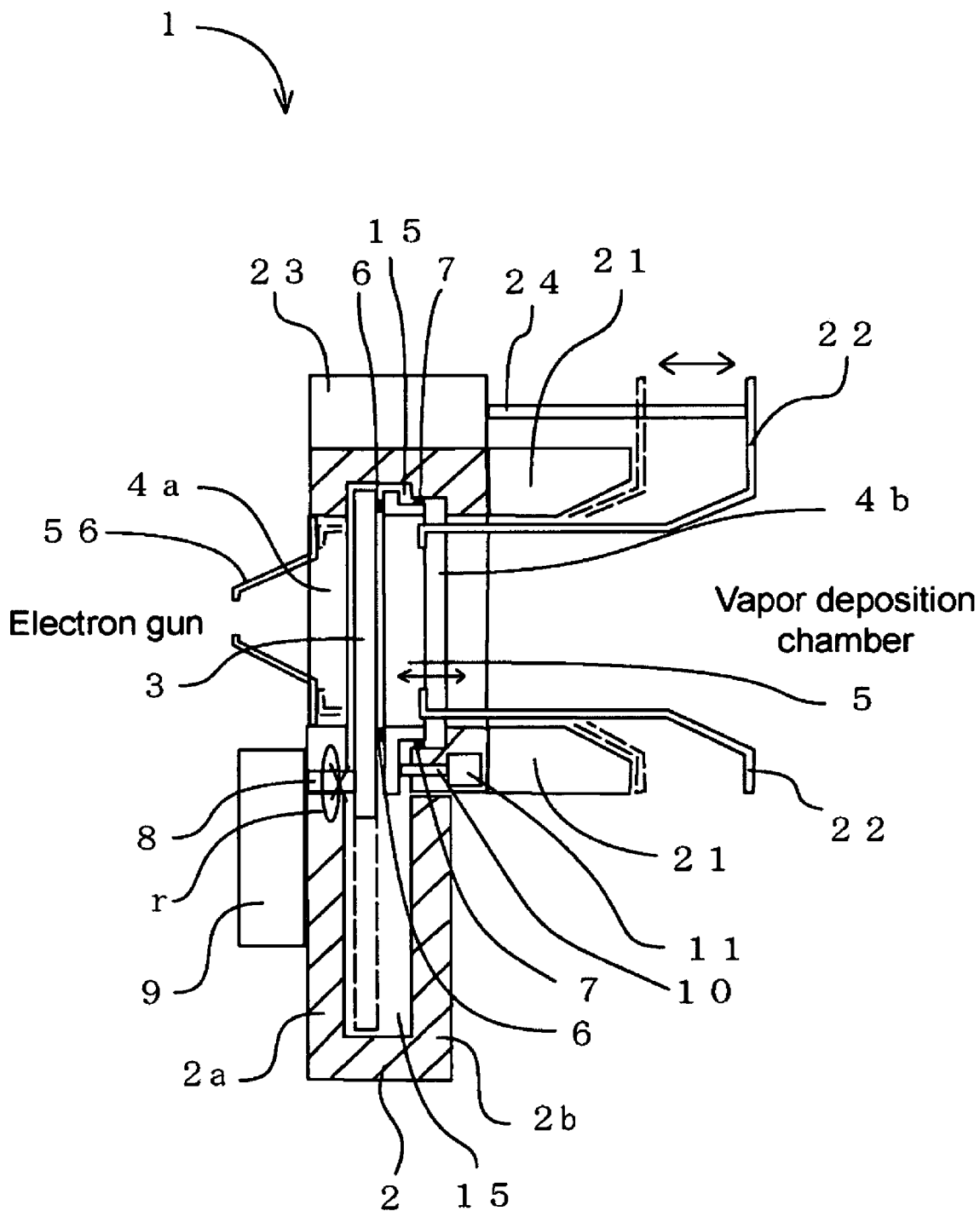
FIG. 1 is an explanatory diagram showing an embodiment of a gate valve for an electron gun according to the present invention (an explanatory diagram showing the inside of the valve casing as viewed from a side of a main body thereof).

DESCRIPTION OF SYMBOLS 1 gate valve for vacuum apparatus
2 valve casing
3 valve body
4a opening (on electron gun side)
4b opening (on vapor deposition chamber side)
5 sealing ring
6 sealing member
7 sealing member
8 actuator shaft
9 air actuator
10 shaft
11 air cylinder
15 valve chamber
21 movable shield receiving member
22 movable shield
23 air cylinder
24 shaft
50 in-line MgO vapor deposition apparatus
51 vapor deposition chamber
52 electron gun
53 exhaust port
54 vaporization source
56 shield (movable shield receiving member)
60 automatic supply mechanism
61 MgO supply chamber
63 MgO feeder
64 MgO shooter
66 air cylinder for driving a supply valve
67 MgO supply valve
68 MgO replenishing port
69 lid of MgO replenishing port
80 vapor deposition target
81 vapor deposition material (MgO)
82 MgO
200 gate valve for vacuum apparatus
202 valve casing
203 valve body
204a, 204b opening
205 sealing ring
206, 207 sealing member
208 actuator shaft
209 air actuator
210 shaft
211 air cylinder
215 valve chamber
231 air cylinder
232 cylinder rod
233 air passage
250 in-line MgO vapor deposition apparatus
251 vapor deposition chamber
252 electron gun
253 exhaust port
254 vaporization source
260 automatic supply mechanism
261 MgO supply chamber
263 MgO feeder
264 MgO shooter
266 air cylinder for driving supply valve
267 MgO supply valve
268 MgO replenishing port
269 lid of MgO replenishing port 280 vapor deposition target
281 vapor deposition material (MgO in molten state)
282 MgO

BEST MODE FOR CARRYING OUT THE INVENTION

Hereinafter, specific embodiments to which the present invention is applied will be described in detail with reference to the drawings.

Figure 4:
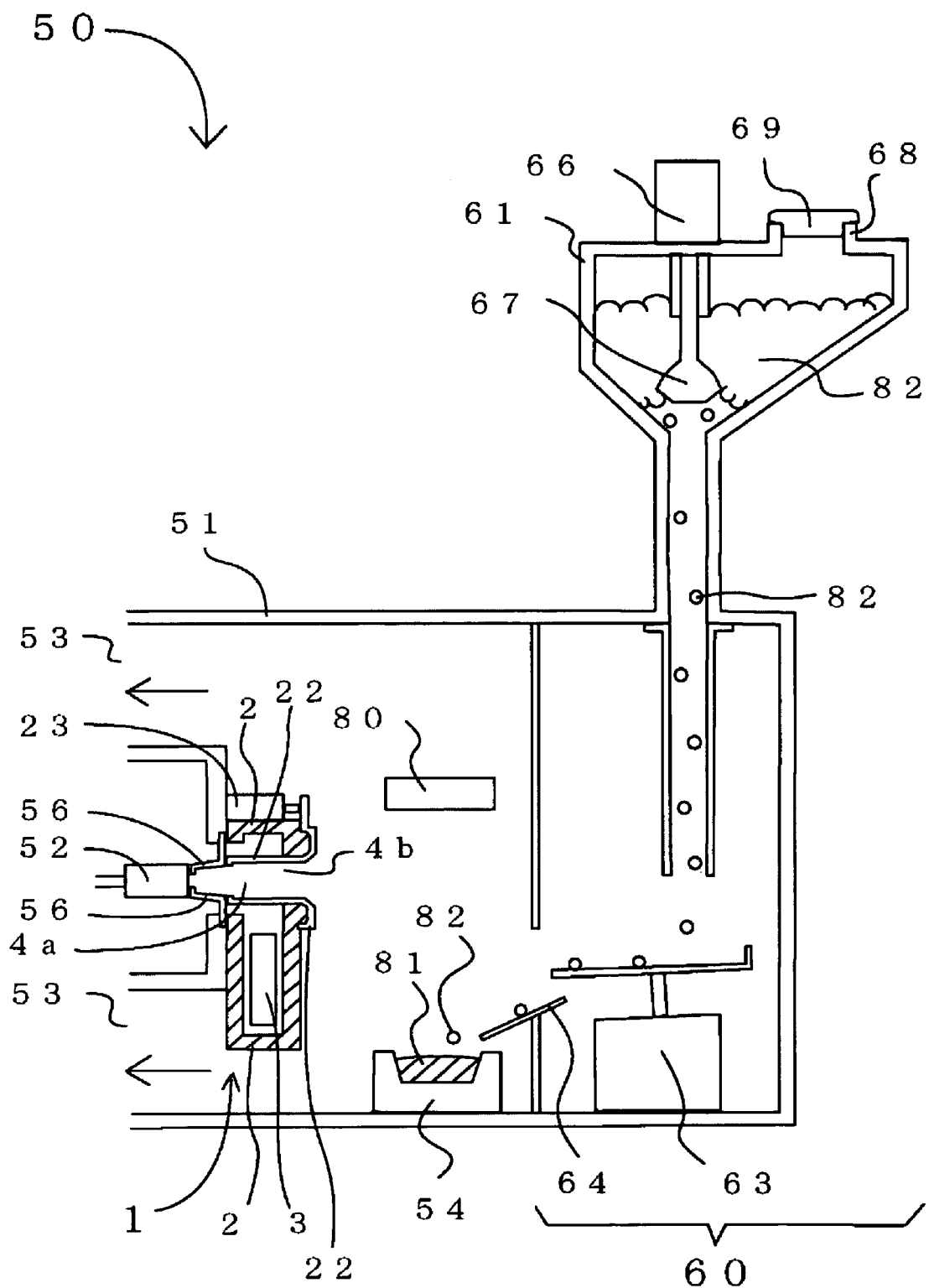
FIG. 4 is an explanatory diagram showing an example of an in-line MgO vapor deposition apparatus using the gate valve for an electron gun of the present invention.

FIG. 4 shows an example of an in-line MgO vapor deposition apparatus 50 using a gate valve 1 for an electron gun of the present invention.

In FIG. 4, the in-line MgO vapor deposition apparatus 50 is structured to keep the inside of a vapor deposition chamber 51 in a vacuum state by using an exhaust device (vacuum pump) (not shown) connected to an exhaust port 53.

To perform a vapor deposition process on a vapor deposition target 80 shown in FIG. 4, a vaporization source 54 containing a vapor deposition material (MgO) 81 is disposed at a position facing the vapor deposition target 80 in a lower part of the apparatus main body.

In addition, an electron gun 52 serving as a heat source for irradiating the vapor deposition material 81 with an electron beam is lateral to the vaporization source 54.

Herein, in front of the electron gun 52, the gate valve for an electron gun 1 is disposed as a valve for separating an electron gun part and the vapor deposition chamber 51. When the gate valve 1 is closed, the electron gun 52 can be maintained while keeping the vapor deposition chamber 51 in a vacuum.

Further, to operate continuously, the vapor deposition apparatus 50 includes an automatic supply mechanism 60 for automatically supplying the vapor deposition material 82. The automatic supply mechanism 60 is constituted of an MgO supply chamber (for storing MgO in a vacuum) 61, an MgO feeder (for quantitatively and continuously supplying MgO to the vaporization source) 63, and an MgO shooter 64.

MgO 82 of about 5 to 200 kg or more is stored in the MgO supply chamber 61, and a required amount of MgO of about 1 to 1.5 kg is intermittently supplied to the MgO feeder 63. To perform the intermittent operation, an MgO supply valve 67 is moved by using an air cylinder 66. The feeder 63 feeds MgO into a hearth 54 through sliding on the MgO shooter 64.

Figure 3:
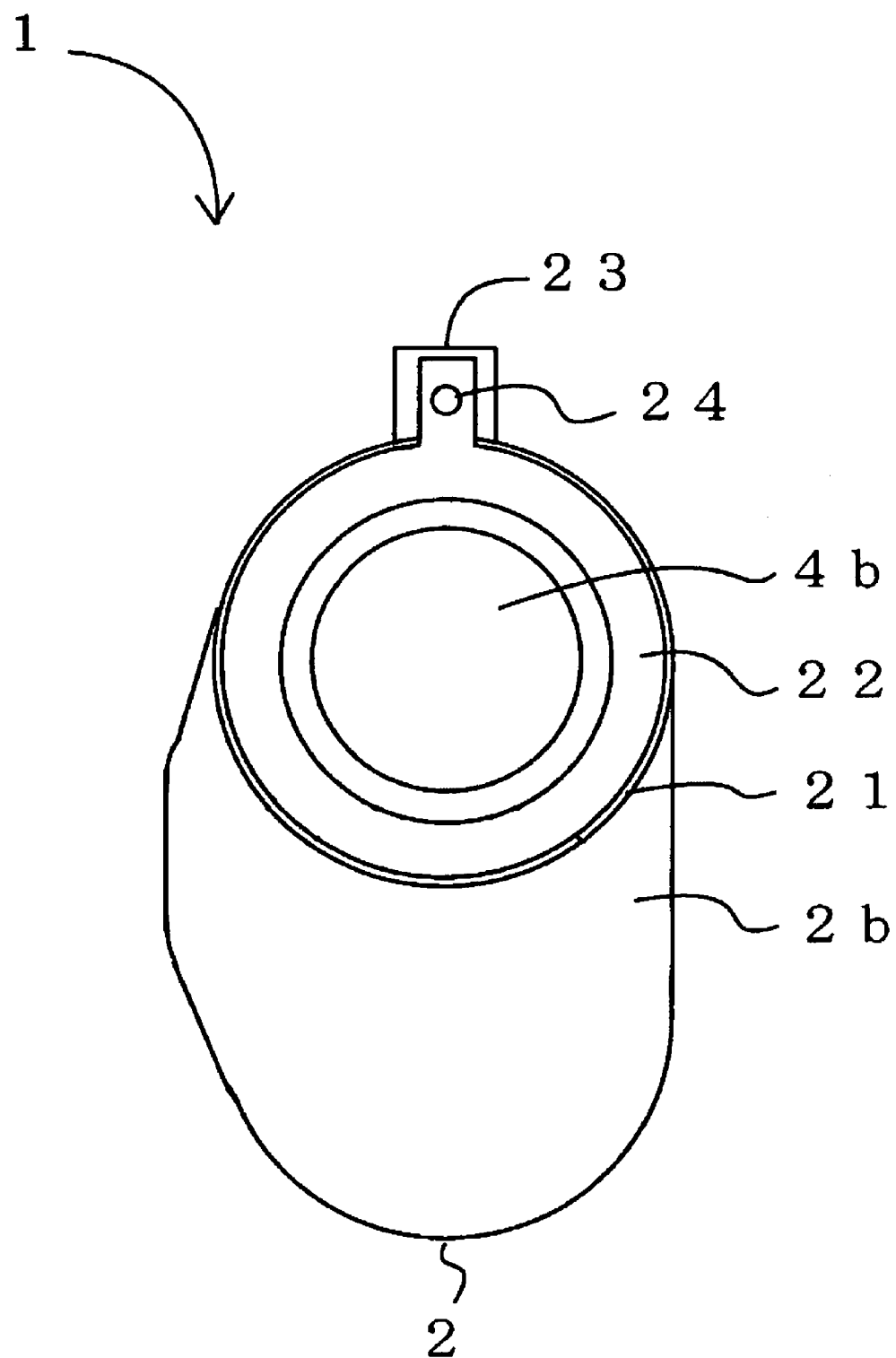
FIG. 3 is an explanatory diagram showing the embodiment of the gate valve for an electron gun according to the present invention (a front view of the outline of the main body of the gate valve for an electron gun, as viewed from a vapor deposition chamber side).

FIGS. 1 and 3 each show an example of the gate valve for an electron gun 1 in the embodiment of the present invention. In this embodiment, as shown in FIG. 1, the inside of the valve casing 2 is the same as that of the pendulum valve for a vacuum apparatus in related art except for a cylindrical movable shield receiving member 21, a cylindrical movable shield 22, an air cylinder 23 for driving the movable shield, and a shaft 24 for attaching the movable shield. As shown in FIG. 3, the gate valve for an electron gun 1 includes an opening 4b formed on a sidewall 2b of the valve casing 2 on a vapor deposition chamber side as viewed from the front. The movable shield receiving member 21 is attached to the surroundings of the opening 4b. The cylindrical movable shield 22 is connected to a tip end portion of the shaft 24, can freely reciprocate so as to pass through the opening 4b, and is structured to be driven by the air cylinder 23 as a drive means. A flange is formed inwardly at an end portion of the movable shield 22 on a the side of opening 4a formed at the sidewall 2a on the electron gun side, while a flange is formed outwardly at an end portion of the movable shield 22 on the opening 4b side. These flanges are used for sealing the valve chamber 15.

Further, when the inside of the valve casing 2 is viewed from the side thereof, the gate valve 1 for an electron gun includes a valve chamber 15, a pendulum valve body 3, and a sealing ring 5. The valve chamber 15 is formed between the sidewalls 2a and 2b facing each other. The pendulum valve body 3 and the sealing ring 5 are provided in the valve casing 2. The openings 4a and 4b are respectively formed on the sidewalls 2a and 2b facing each other. Ring-shaped sealing members 6 and 7 are attached to the sealing ring 5 (FIG. 1).

When closing the valve 1 in the open state, an air actuator 9 immediately lateral to the valve casing 2 is driven by using an air pressure, and an actuator shaft 8 is rotated to thereby move the pendulum valve body 3 up to the front of the opening 4a, i.e., a valve closing position. Then, the air cylinder 11 is driven by the air pressure to move the shaft 10, and the sealing ring 5 is pressed against the valve body 3. Thus, a gap between the inner wall surface of the surrounding of the opening 4b and the sealing ring 5 is sealed with the sealing member 7, while a gap between the surface of the valve body 3 and the sealing ring 5 is sealed with the sealing member 6 inside the valve casing 2. As a result, a space between the opening 4a and the opening 4b is blocked.

A function of the movable shield according to the embodiment of the present invention will be described with reference to FIG. 2. FIGS. 2A and 2B each show the gate valve for an electron gun of this embodiment in an open state and a close state, respectively.

Figure 2A:
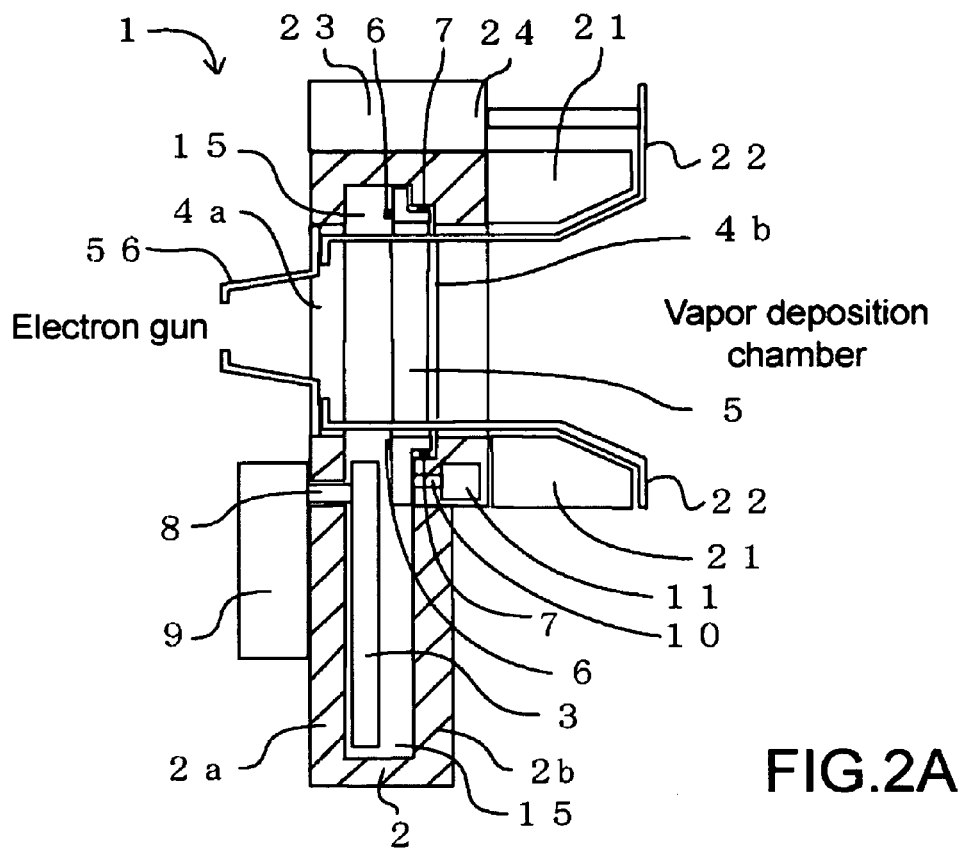

FIG. 2A shows the valve in the open state. When the valve is open, the cylindrical movable shield 22 protects the valve chamber 15. Specifically, when the valve is open, the movable shield 22 is inserted from the opening 4b on the vapor deposition chamber side, caused to pass through the valve chamber 15, and brought into abutment against a shield 56 that doubles as a movable shield receiving member through the opening 4a on the electron gun side. The end portion of the movable shield 22 on the opening 4a side forms an inward flange. The flange is in close contact with the flange of the shield 56 (made of SUS304). As a result, the valve chamber 15 is atmospherically separated into the inner side of the movable shield 22 and the outer side thereof.

In addition, the end portion of the movable shield 22 on the opening 4b side forms an outward flange, which is in close contact with an end surface and an inward side surface of the shield receiving member 21 on the opening 4b side. As a result, the valve chamber 15 is completely sealed. Thus, the valve chamber 15 except the inward side of the movable shield 22 is completely separated from the vapor deposition chamber, so the inner wall surface of the valve casing 2, the valve body 3, and the sealing members 6 and 7 of the sealing ring 5 are reliably protected, which can prevent adhesion of foreign substances.

Figure 2B:
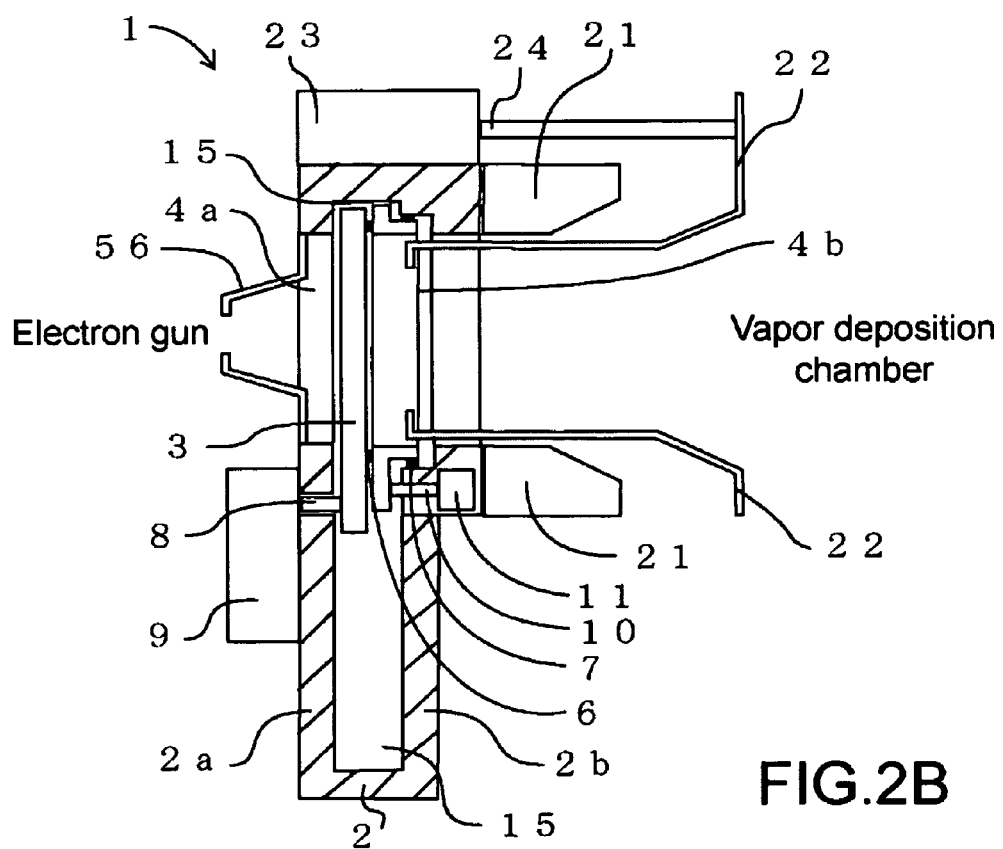

FIG. 2B shows the valve in the closed state. In this case, the valve body 3 and the sealing ring 5 seal the valve like the gate valve in related art. The valve body 3 is moved to a closed position and the sealing ring 5 is pressed against the valve body 3 to thereby close the valve.

Figure 5:
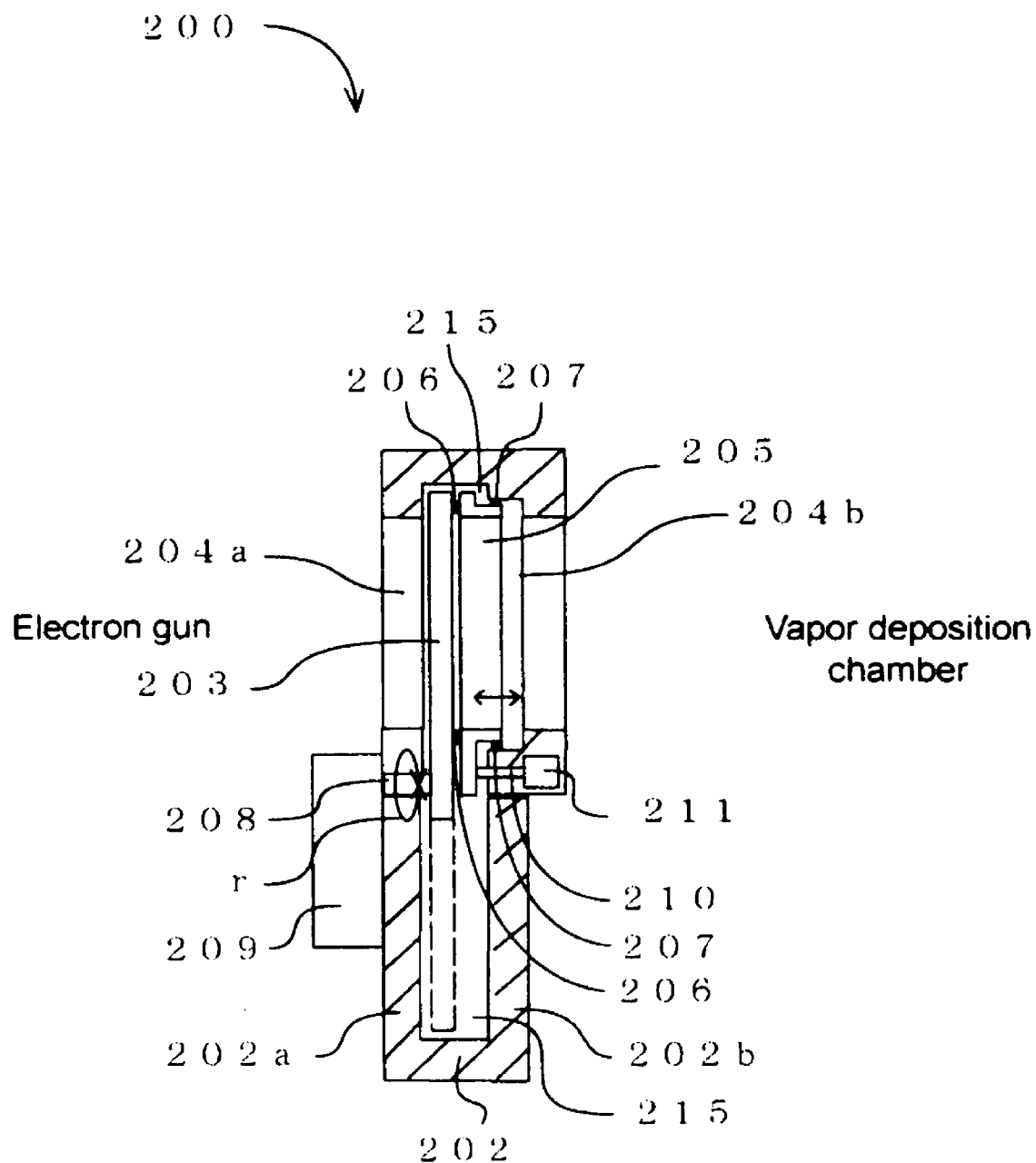
FIG. 5 is an explanatory diagram showing an example of a gate valve for a vacuum apparatus in related art (an explanatory diagram showing the inside of the valve casing as viewed from a side of a main body thereof).
Figure 6:
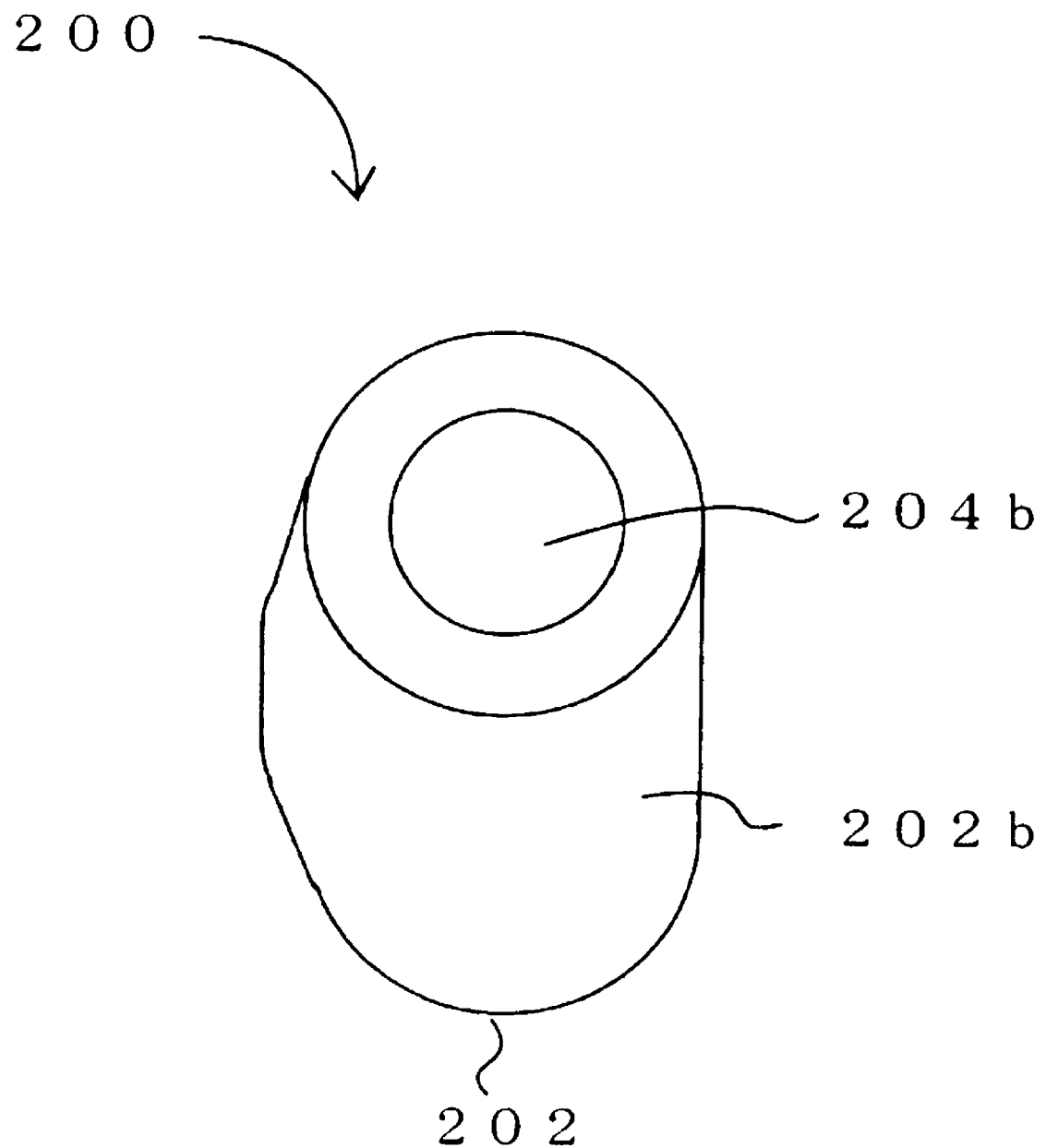
FIG. 6 is an explanatory diagram showing the example of the gate valve for a vacuum apparatus in related art (a front view as viewed from a vapor deposition chamber side).
Figure 7:
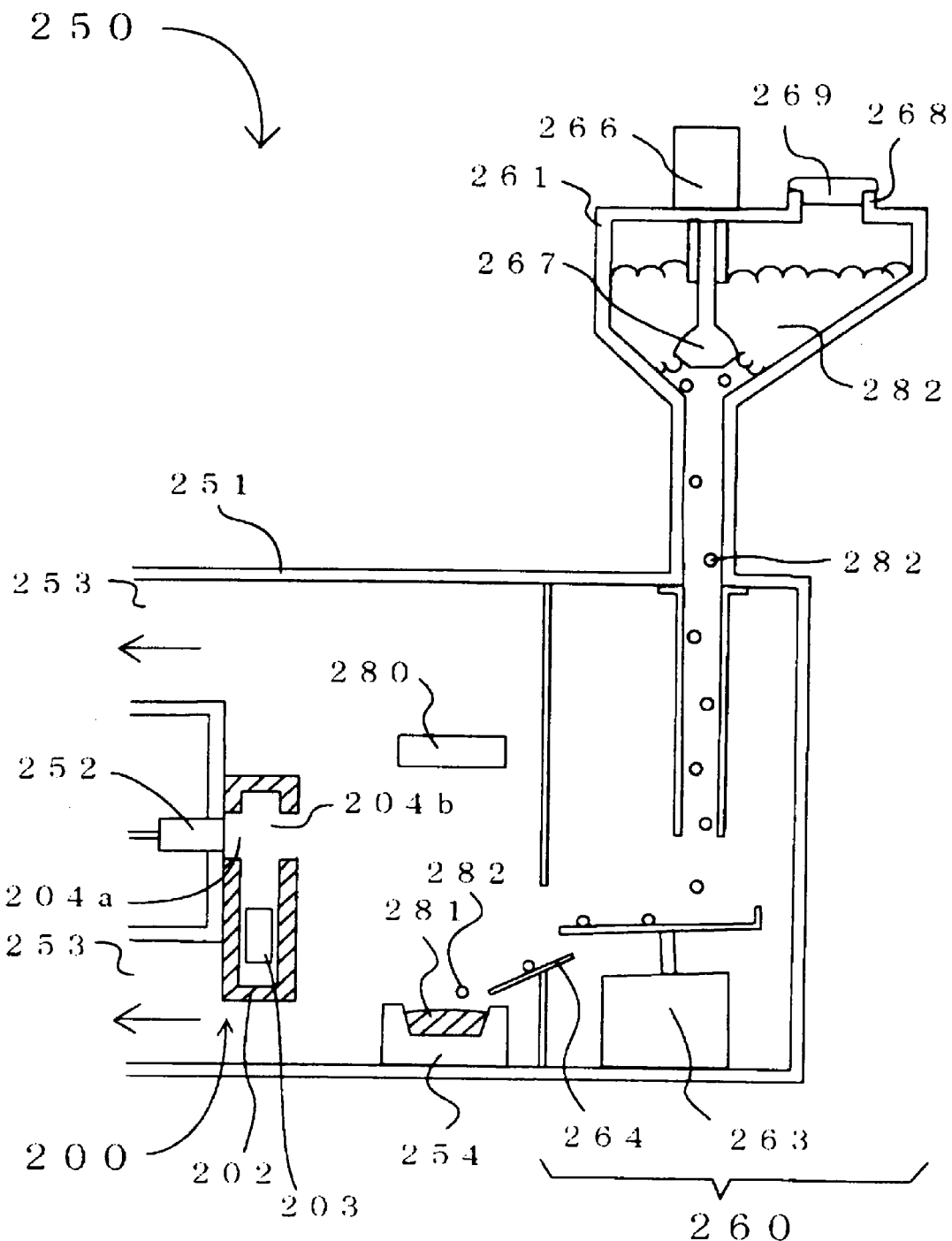
FIG. 7 is an explanatory diagram showing an example of an in-line MgO vapor deposition apparatus using the gate valve for a vacuum apparatus in related art.

It should be noted that the mechanism in which the valve body 3 is moved and the sealing ring 5 is pressed against the valve body 3 to thereby close the valve is the same as that in related art as shown in FIGS. 5 and 6.

With the structure described above, downtime in the continuous operation of the in-line MgO vapor deposition apparatus can be reduced.

A time period for maintenance of the electron gun when the valve is normally operated is 55 minutes in total, specifically, 30 minutes for cooling, 5 minutes for venting, 10 minutes for maintenance of the electron gun, and 10 minutes for evacuation.

Meanwhile, a time period for maintenance of the electron gun when the valve is not normally operated is 410 minutes in total, specifically, 30 minutes for cooling, 10 minutes for venting the electron gun chamber and the vapor deposition chamber, 10 minutes for maintenance of the electron gun, and 360 minutes for evacuation.

Therefore, the downtime of 355 minutes can be reduced.

Heretofore, the embodiments of the present invention are described. Of course, the present invention is not limited to those, and variations can be made based on the technical idea of the present invention.

In the examples of the gate valve for an electron gun of the present invention, the structure of the valve casing 2 and valve body 3 is the same as that in the case of the gate valve for a vacuum apparatus using the pendulum valve body in related art shown in FIGS. 5 and 6. Alternatively, a gate valve for a vacuum apparatus which has another structure may be used. For example, an inflation-sealing gate valve, a gate valve including a sector-shaped valve body, or a ball valve may be used. It is possible to use any gate valve for a vacuum apparatus as long as it includes a valve casing in which openings passing through wall surfaces facing each other are formed and a valve chamber in which a valve body in an open position can completely get away from the opening. In the example described above, the opening of the valve is circular, but another shape can of course be adapted. For example, if the opening of the valve is square, the cross section of the cylindrical body may be square.

Further, when the valve is opened, the movable shield 22 is brought into abutment against the shield 56 that doubles as the movable shield receiving member, but this is not always necessary. Alternatively, the movable shield 22 may be stopped close to the shield 56 that doubles as the movable shield receiving member while leaving a space to such an extent as to provide a conductance at which atmospheric separation can be carried out in a vacuum, e.g., 5 mm or less.

Further, as a variation of the present invention, a mechanism for cooling the movable shield 22 may be provided. When the gate valve for an electron gun is in the open position, the movable shield 22 sealing the valve chamber 15 is cooled to thereby cool the inside of the valve casing 2. It is therefore possible to prevent degradation of the sealing members 6 and 7 due to heat. For example, when the valve is in the open position, the movable shield 22 is in close contact with the receiving member 21, so the degradation can be prevented by providing, on a surface in contact with the movable shield 22 of the receiving member 21, a metallic pipe in which cooling water is circulated.

Further, in the examples of the present invention, the shield 56 that doubles as the movable shield receiving member is made of a stainless steel. Alternatively, the shield 56 may be made of a soft metal in order to enhance adhesiveness.

Examples of the soft metal include an extra-mild steel, a mild steel, a pure iron, copper, aluminum, zinc, lead, and tin.

Furthermore, as another variation of the present invention, on a surface in contact with the flanges on both end portions of the movable shield 22 or with the movable shields of the movable shield receiving members 21 and 56, a sealing member made of, for example, an extra-mild steel, a mild steel, a pure iron, copper, aluminum, zinc, lead, or tin may be provided.

Any material mentioned above can enhance adhesiveness of the contact portion between the movable shield 22 and the movable shield receiving members 21 and 56, with the result that the shielding effect can be increased.

The invention claimed is:

1. A vapor deposition apparatus, comprising:
   a deposition chamber;
   an electron gun; and
   a gate valve for separating the deposition chamber and the electron gun, the gate valve including;
      a valve casing having a first sidewall located on the electron gun side and a second sidewall located on the deposition chamber side, the first side wall having a first opening for passing through an electron beam emitted from the electron gun, the second sidewall facing the first sidewall and having a second opening for passing through the electron beam;
      a valve body for opening/closing the first opening and the second opening, the valve body provided in the valve casing;
      a first receiving member provided on the first opening side of the valve casing;
      a second receiving member provided on the second opening side of the valve casing;
      a cylindrical movable shield inserted from the second opening into the valve casing, the cylindrical movable shield having a first flange formed inwardly at a first tip end on the first opening side and a second flange formed outwardly at a second tip end on the second opening side, the first flange being capable of contact with the first receiving member, the second flange being capable of contact with the second receiving member; and
      a driving unit for causing the cylindrical movable shield to reciprocate in the direction of passing through the second opening, the driving unit configured to move the cylindrical shield to a position where the first flange is in contact with the first receiving member and the second flange is in contact with the second receiving member when opening the valve body.

* * * * *